United States Patent
Dastidar

(10) Patent No.: US 7,373,621 B1
(45) Date of Patent: May 13, 2008

(54) CONSTRAINT-DRIVEN TEST GENERATION FOR PROGRAMMABLE LOGIC DEVICE INTEGRATED CIRCUITS

(75) Inventor: Jayabrata Ghosh Dastidar, San Jose, CA (US)

(73) Assignee: Altera Corporation, San Jose, CA (US)

(*) Notice: Subject to any disclaimer, the term of this patent is extended or adjusted under 35 U.S.C. 154(b) by 353 days.

(21) Appl. No.: 11/048,356

(22) Filed: Feb. 1, 2005

(51) Int. Cl.
*G06F 17/50* (2006.01)

(52) U.S. Cl. ............... 716/4; 716/5; 716/16; 716/17

(58) Field of Classification Search ........ 714/725–727, 714/4, 5, 6, 7, 16; 716/1–18
See application file for complete search history.

(56) References Cited

U.S. PATENT DOCUMENTS

| | | | |
|---|---|---|---|
| 5,572,717 A | 11/1996 | Pedersen | |
| 5,608,337 A | 3/1997 | Hendricks et al. | |
| 6,112,020 A | 8/2000 | Wright | |
| 6,167,364 A | 12/2000 | Stellenberg et al. | |
| 6,195,772 B1 | 2/2001 | Mielke et al. | |
| 6,301,694 B1* | 10/2001 | Lee et al. | 716/11 |
| 6,609,229 B1* | 8/2003 | Ly et al. | 716/4 |
| 2002/0178432 A1* | 11/2002 | Kim et al. | 716/18 |
| 2003/0212940 A1* | 11/2003 | Wong | 714/725 |
| 2004/0088666 A1* | 5/2004 | Poznanovic et al. | 716/7 |
| 2005/0034091 A1* | 2/2005 | Harn | 716/6 |

OTHER PUBLICATIONS

"Interconnect Delay Testing Of Design Programmable Logic Devices", Proceeding of the International test Conference (ITC) 2004, Oct. 16-28, 2004 , IEEE.*
"FastScan and the ATPG Product Family," Datasheet of Mentor Graphics (2003).
"TeraMAX ATPG," Datasheet of Synopsys, Inc. (May 1999).

* cited by examiner

*Primary Examiner*—Paul Dinh
*Assistant Examiner*—Nha Nguyen
(74) *Attorney, Agent, or Firm*—Treyz Law Group; G. Victor Treyz

(57) ABSTRACT

A programmable logic device test generation tool is provided that produces test configuration data and test vectors for testing programmable logic device integrated circuits. A graph generation tool converts a netlist or other circuit description of a programmable logic device integrated circuit into a graph having nodes and edges. A timing analysis tool may be used to help produce test constraints. Based on the test constraints, an automatic test generator processes the graph to produce the test configuration data and test vectors. In processing the graph with the automatic test generator, the graph may be divided into multiple testable subgraphs. Each subgraph may be processed using an iterative approach in which a cost function threshold is adjusted in a number of steps until a target test coverage is obtained or processing saturates.

22 Claims, 15 Drawing Sheets

| SESSION NUMBER | A<br>EDGES AVAILABLE TO TEST | B<br>TIMING CONSTRAINT | C<br>I/O PINS AVAILABLE | D<br>CIRCUITS ELIMINATED AS NOT NECESSARY TO TEST | E<br>CIRCUITS REQUIRING PACKAGE TO TEST |
|---|---|---|---|---|---|
| 1 | SUBSET DETERMINED BY TIMING ANALYSIS | > 100 ps | NONE | NONE | NONE |
| 2 | SUBSET DETERMINED BY TIMING ANALYSIS | > 100 ps | A SUBSET | NONE | NONE |
| ... | | | | | |

FIG. 16

CONSTRAINT-DRIVEN TEST GENERATION FOR PROGRAMMABLE LOGIC DEVICE INTEGRATED CIRCUITS

BACKGROUND OF THE INVENTION

This invention relates to programmable logic device integrated circuits, and more particularly, to testing programmable logic device integrated circuits.

Programmable logic devices are a type of integrated circuit that can be customized by a user to implement a desired logic design. In a typical scenario, a logic designer uses a logic design system to design a logic circuit. The logic design system uses information on the hardware capabilities of a given programmable logic device to help the designer implement the logic circuit using the resources available on the given programmable logic device. The logic design system creates configuration data. When the configuration data is loaded into the programmable logic device, it programs the logic of the programmable logic device so that the programmable logic device implements the designer's logic circuit.

It is generally desirable to test programmable logic device integrated circuits during manufacturing. If a fault is detected, a programmable logic device integrated circuit can be repaired or discarded.

During testing, a programmable logic device is loaded with sets of test configuration data. After each set of test configuration data has been loaded, test vectors are applied to the device and the resulting operation of the device is monitored to identify faults.

Unless a programmable logic device design contains only simple patterns of conductive interconnects and programmable connections, it can be computationally intensive to generate appropriate sets of test configuration data and test vectors to be applied to the device during testing. Modern programmable logic devices often have complex architectures and are highly programmable. The highly-programmable nature of these devices makes it challenging to efficiently produce test configuration data and test vectors that will provide an acceptable level of test coverage.

It would therefore be desirable to provide improved ways in which to test programmable logic device integrated circuits.

SUMMARY OF THE INVENTION

In accordance with the present invention, methods and apparatus for testing integrated circuits such as programmable logic device integrated circuits are provided. Programmable logic devices contain programmable connections and other programmable logic circuits that are configured by loading configuration data into associated programmable elements. The loaded configuration data causes the programmable elements to apply control signals to the programmable connections and other programmable logic that program the programmable connections and other programmable logic to perform desired operations.

To test programmable logic devices a programmable logic device test generation tool generates test configuration data and test vectors. A tester loads the test configuration data into a programmable logic device integrated circuit. After the test configuration data has been loaded, the test vectors may be applied to the programmable logic device and the resulting output signals from the device may be monitored to evaluate whether the device is performing properly. Multiple sets of test configuration data and test vectors may be used by the tester during testing to thoroughly test the device.

A programmable logic device integrated circuit may be described using a netlist or other circuit description. A graph generation tool in the programmable logic device test generation tool may convert the circuit description into a graph G. In the graph G, nodes represent circuit components such as programmable logic elements, registers, I/O pins, and fixed interconnects. Edges in graph G represent programmable connections.

The graph G is processed in multiple sessions by an automatic test generator in the programmable logic device test generation tool. The automatic test generator applies different sets of test constraints to the graph G to extract multiple testable subgraphs. A cost function C can be used to produce the test constraints used in extracting the testable subgraphs. As each extracted testable subgraph is processed by the automatic test generator, a corresponding set of test configuration data and test vectors is created. The combination or union of these sets of test configuration data and test vectors are used by the tester to test the programmable logic device integrated circuit represented by the graph G.

During testing of each extracted testable subgraph, the automatic test generator may enforce restrictions on the number of graph edges that may be present in a valid test path. The automatic test generator may compute a cost function C for each edge and compare this value to a cost threshold Cth to determine whether that edge should be included as part of the testable subgraph. The value of the cost function threshold may be incremented or decremented in successive iterations to allow larger or smaller subgraphs to be included.

Any suitable cost function may be implemented by the automatic test generator.

An example of a suitable cost function is a cost function that imposes costs based on path lengths. Using this approach, the automatic test generator may process each extracted testable subgraph in an iterative fashion. During a first iteration, a subset of the extracted testable subgraph is processed. The maximum number of edges allowed in a given path (the hop number index) is then increased, to increase the size of the graph subset being processed. Further increments to the hop number index may be made until it is determined that a target test coverage has been achieved or that progress in processing the extracted testable subgraph has saturated so that further hop number index increments should not be made.

As another example, a cost function approach may be used in which the automatic test generator probabilistically selects an edge in a given iteration if it has already been tested in a previous iteration.

With the present invention, testing constraints can be developed that are generic and are not specific to any particular integrated circuit architecture. Constraints can be handled in an architecture-independent manner. The test generation techniques of the present invention can be used to extract sub-graphs and process them for test generation. These capabilities are not tied to any specific integrated circuit architecture.

Further features of the invention, its nature and various advantages will be more apparent from the accompanying drawings and the following detailed description of the preferred embodiments.

BRIEF DESCRIPTION OF THE DRAWINGS

FIG. 16 is a table showing how a circuit to be tested can be analyzed in multiple sessions with different sets of test constraints in accordance with the present invention.

DETAILED DESCRIPTION OF THE PREFERRED EMBODIMENTS

The present invention relates to testing integrated circuits. In particular, the invention relates to systems and methods for generating and using test configuration data and test vectors to test integrated circuits.

The integrated circuits being tested in accordance with the invention may be, for example, programmable logic devices. The invention also applies to the testing of integrated circuits with programmable capabilities that are not typically referred to as "programmable logic devices." Such programmable integrated circuits may include, for example, application specific integrated circuits with regions of programmable logic, digital signal processors containing programmable logic, microprocessors or microcontrollers with programmable logic regions, etc. For clarity, however, the present invention will be described in the context of programmable integrated circuits such as programmable logic devices.

Figure 1:
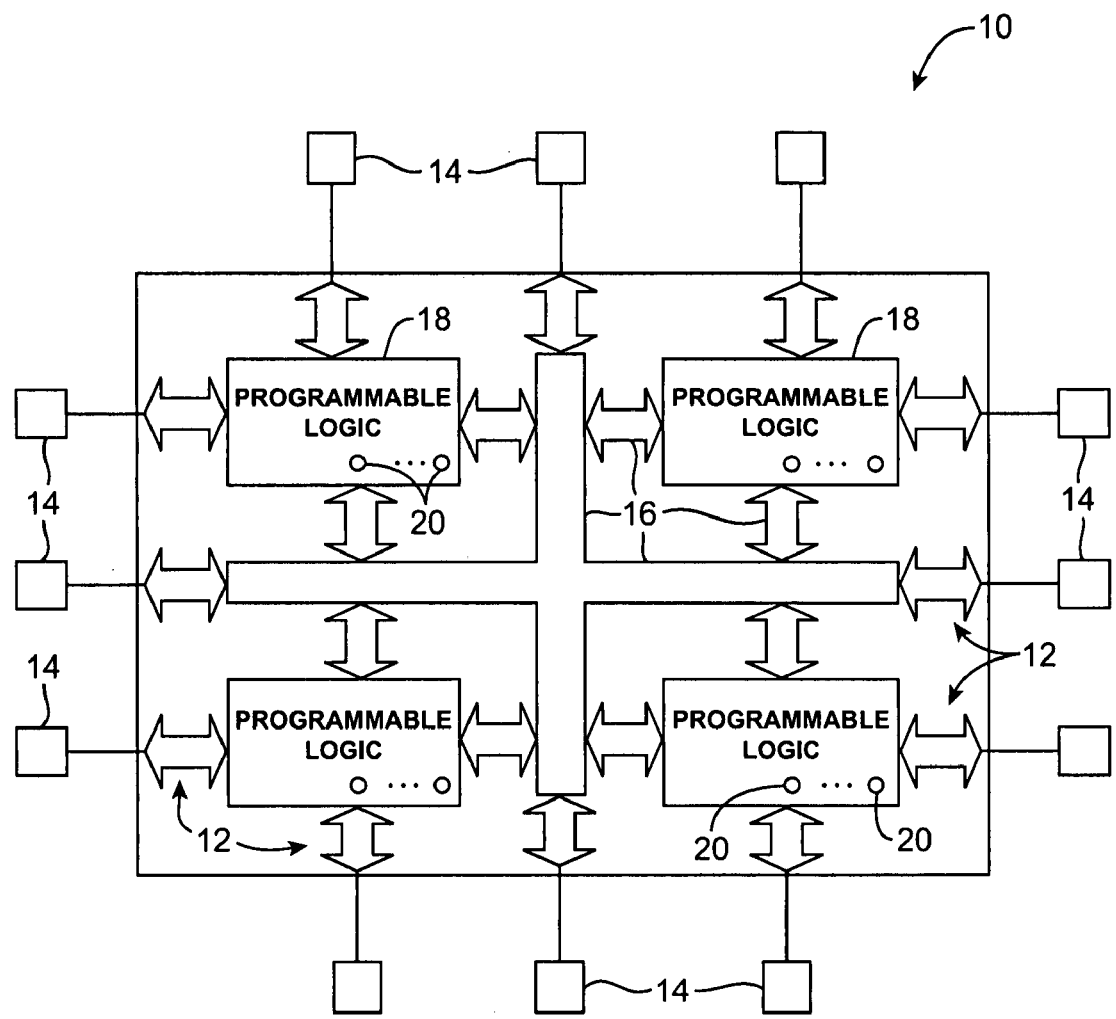
FIG. 1 is a diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 may be based on any suitable programmable technology. With one suitable approach, configuration data (also called programming data) may be loaded into programmable elements 20 using pins 14 and input/output circuitry 12. Once loaded, the programmable elements (also sometimes called configuration bits or programmable function control elements) each provide a static control output signal that controls the state of an associated logic component in programmable logic 18.

As an example, the programmable elements 20 may be random-access memory (RAM) cells that are loaded from an external erasable-programmable read-only memory and control chip via pins 14 and input/output circuitry 12. The loaded RAM cells 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 10, programmable elements are preferably provided with configuration data by a user (e.g., a logic designer). Once loaded with configuration data, the programmable elements 20 selectively control (e.g., turn on and off) portions of the circuitry in the programmable logic 18 and thereby customize its functions so that it will operate as desired.

Figure 2:
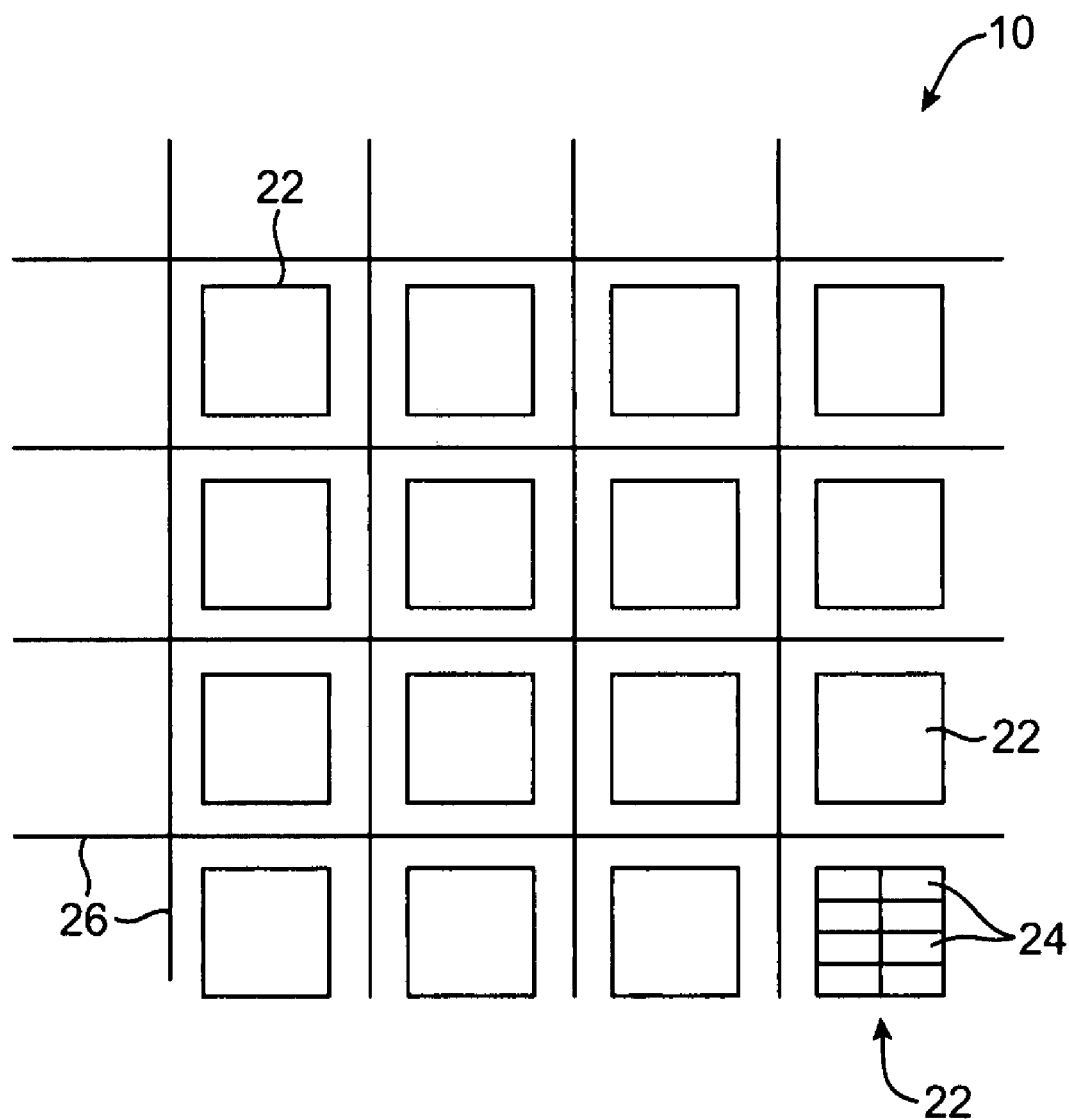
FIG. 2 is a diagram of an illustrative programmable logic device integrated circuit in accordance with the present invention showing how programmable logic may be provided using rows and columns of programmable circuitry.

The circuitry of device 10 may be organized using any suitable architecture. As an example, the logic of programmable logic device 10 may be organized in a series of rows and columns of larger programmable logic regions 22 each of which contains multiple smaller logic regions 24 as shown in FIG. 2. The logic resources of device 10 may be interconnected by interconnection resources such as associated vertical and horizontal conductors 26. Conductors 26 may include global conductive lines that span substantially all of device 10, fractional lines such as half-lines or quarter lines that span part of device 10, staggered lines of a particular length (e.g., sufficient to interconnect several logic areas), smaller local lines that interconnect logic regions 24 with other logic regions 24 in a given region 22, or any other suitable interconnection resource arrangement. If desired, the logic of device 10 may be arranged in more levels or layers in which multiple large regions 22 are interconnected to form still larger portions of logic. Still other device arrangements may use logic that is not arranged in rows and columns.

In some logic devices 10, the larger portions of logic such as logic region 22 may be referred to as "logic array blocks" (LABs) and the smaller portions of logic such as logic regions 24 may be referred to as logic elements (LEs). This is merely one illustrative logic device arrangement 10. For clarity, the present invention will sometimes be described in terms of "logic elements" 24. In general, however, the logic of device 10 may be provided using any suitable programmable logic device architecture.

Figure 3:
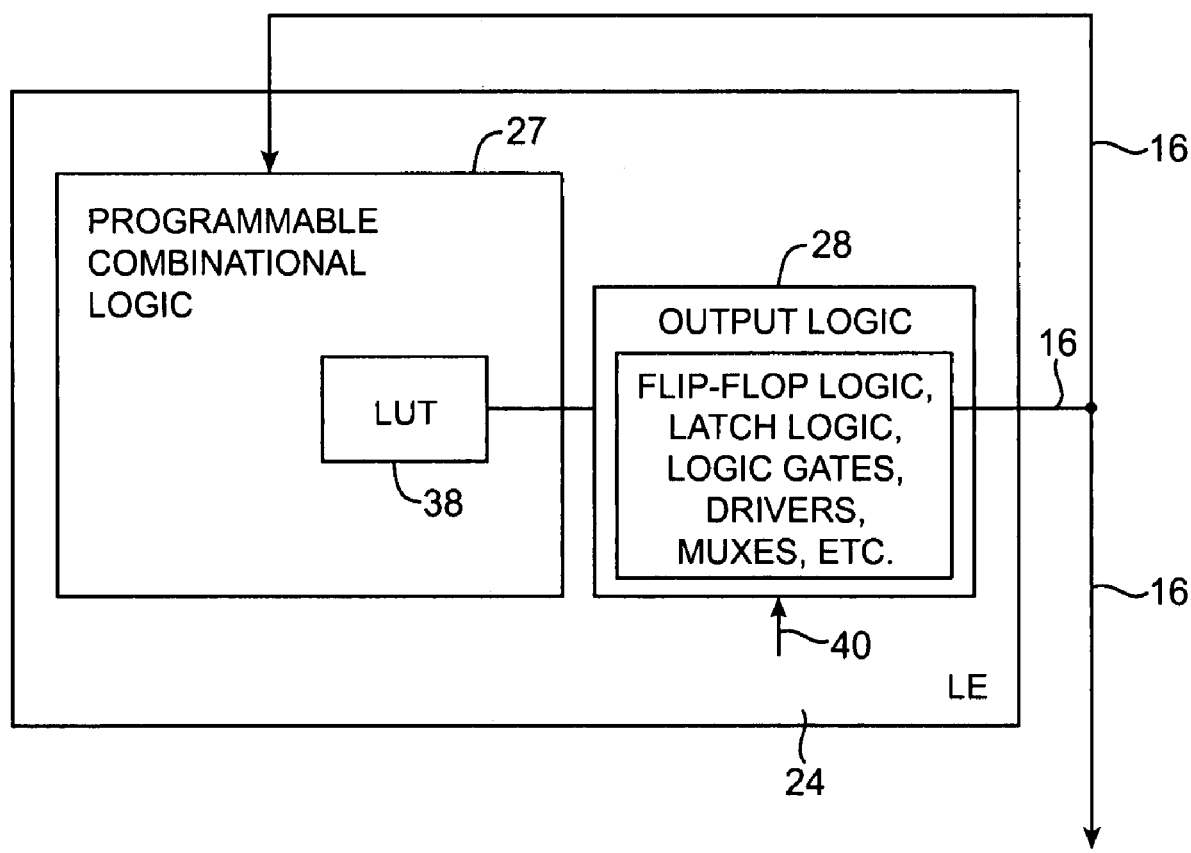
FIG. 3 is a diagram of a programmable logic device logic element in accordance with the present invention.

An illustrative programmable logic device logic element 24 is shown in FIG. 3. Programmable logic element 24 may have programmable combinational logic 27. Combinational logic 27 may use a look-up table such as look-up table 38 or any other suitable combinational logic to produce its output. Output logic 28 may include flip-flop logic, latch logic, logic gates, drivers, multiplexers (muxes), and other suitable logic circuitry. The output logic 28 may be controlled by data and/or control signals, as shown by line 40. The logic element output logic 28 may provide the output of combinational logic 27 to logic on device 10 via interconnection resources 16.

The programmable logic 18 of device 10 includes programmable connections (e.g., programmable interconnects arranged in the form of multiplexers, etc.), programmable devices in logic regions 22 and 24 (e.g., in look-up table logic 38 and output logic 28), etc. This programmable logic is programmed by loading configuration data into programmable elements 20. During testing, programmable logic devices 10 are loaded with test configuration data. The test configuration data places the logic of device 10 into a test configuration. In this test configuration, test vectors can be applied to the device and the results of this testing may be monitored. In a typical test, numerous sets of test configuration data and test vectors may be applied to the device 10.

Tests may be performed during the manufacturing process. If testing reveals a defect in a given programmable logic device, that device can often be repaired before the manufacturing process is complete. The repaired device may then be sold to a customer.

Figure 4:
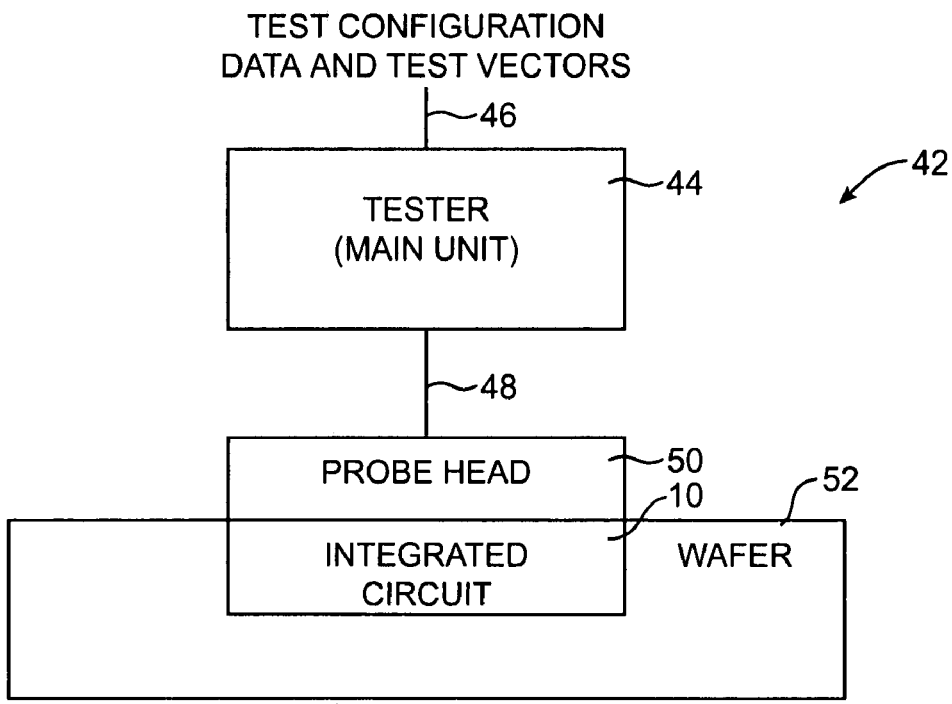
FIG. 4 is a diagram of a tester for testing unpackaged programmable integrated circuits in accordance with the present invention.
Figure 5:
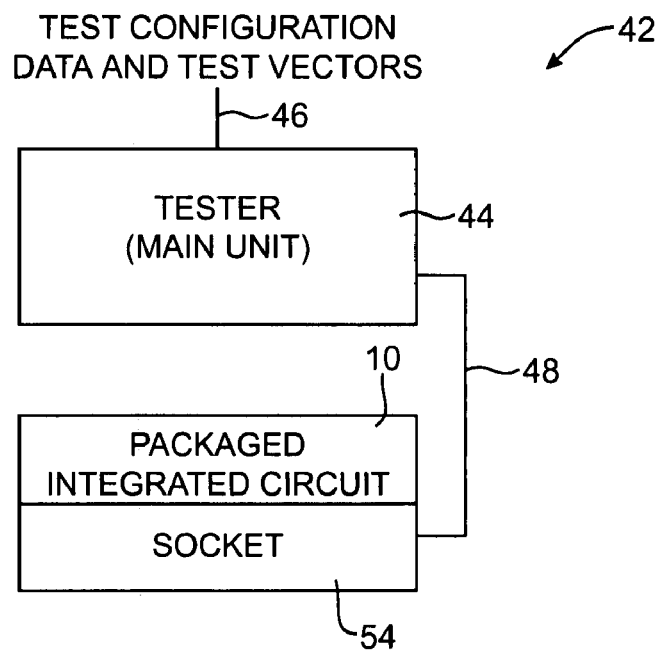
FIG. 5 is a diagram of a tester for testing packaged programmable integrated circuits in accordance with the present invention.

Tests may be performed when programmable logic devices are unpackaged such as when part of a silicon wafer or may be performed after a wafer has been diced into individual integrated circuit die and the die have been packaged. Illustrative testers that may be used to test packaged and unpackaged programmable logic device integrated circuits 10 are shown in FIGS. 4 and 5. FIG. 4 shows a tester 42 that is used to test unpackaged integrated circuits. FIG. 5 shows a tester 42 that is used to test packaged integrated circuits.

As shown in FIG. 4, tester 42 may include a main unit 44. At input 46, main unit 44 may receive test configuration data and test vectors to be applied to programmable logic device integrated circuit 10 during testing. Integrated circuit tester main unit 44 includes computing equipment such a computer or embedded processor. Unit 44 may be networked with other computers if desired. During testing; main unit 44 can gather and analyze output signals from circuit 10 to determine whether circuit 10 is performing properly.

Main unit 44 is connected to a probe head 50 via cable 48. Using a position controller, main unit 44 may position head 50 adjacent to programmable logic device integrated circuit 10. Programmable logic device integrated circuit 10 may be an unpacked individual die or may be part of a wafer 52, as shown in FIG. 4. If device 10 is part of a wafer 52, the probe head 50 may be positioned relative to wafer 52 so that an appropriate integrated circuit 10 that is contained in wafer 52 is positioned at head 50. When probe head 50 is placed into contact with device 10, probe tips in head 50 mate with electrical contacts in device 10.

Sometimes it is desirable to test integrated circuits after they have been packaged. This approach may be advantageous, for example, when an integrated circuit contains sensitive circuitry that is difficult to test in unpackaged environments. A tester 42 that may be used to test a packaged programmable logic device integrated circuit 10 is shown in FIG. 5. As shown in FIG. 5, integrated circuit tester 42 includes a main unit 44. Main unit 44 is electrically connected to a socket 54 by a cable 48. Socket 54 has conductive structures that mate with the pins of the package of integrated circuit 10. Positioning equipment may be used to position each integrated circuit 10 that is to be tested into electrical contact with socket 54 of FIG. 5.

During testing using the testers 42 of FIGS. 4 and 5, test configuration data is loaded into device 10 to place device 10 into a desired logic configuration. Test vectors are then applied and the results of this test are monitored. Complete testing requires the loading of multiple sets of test configuration data and multiple corresponding sets of test vectors.

Figure 6:
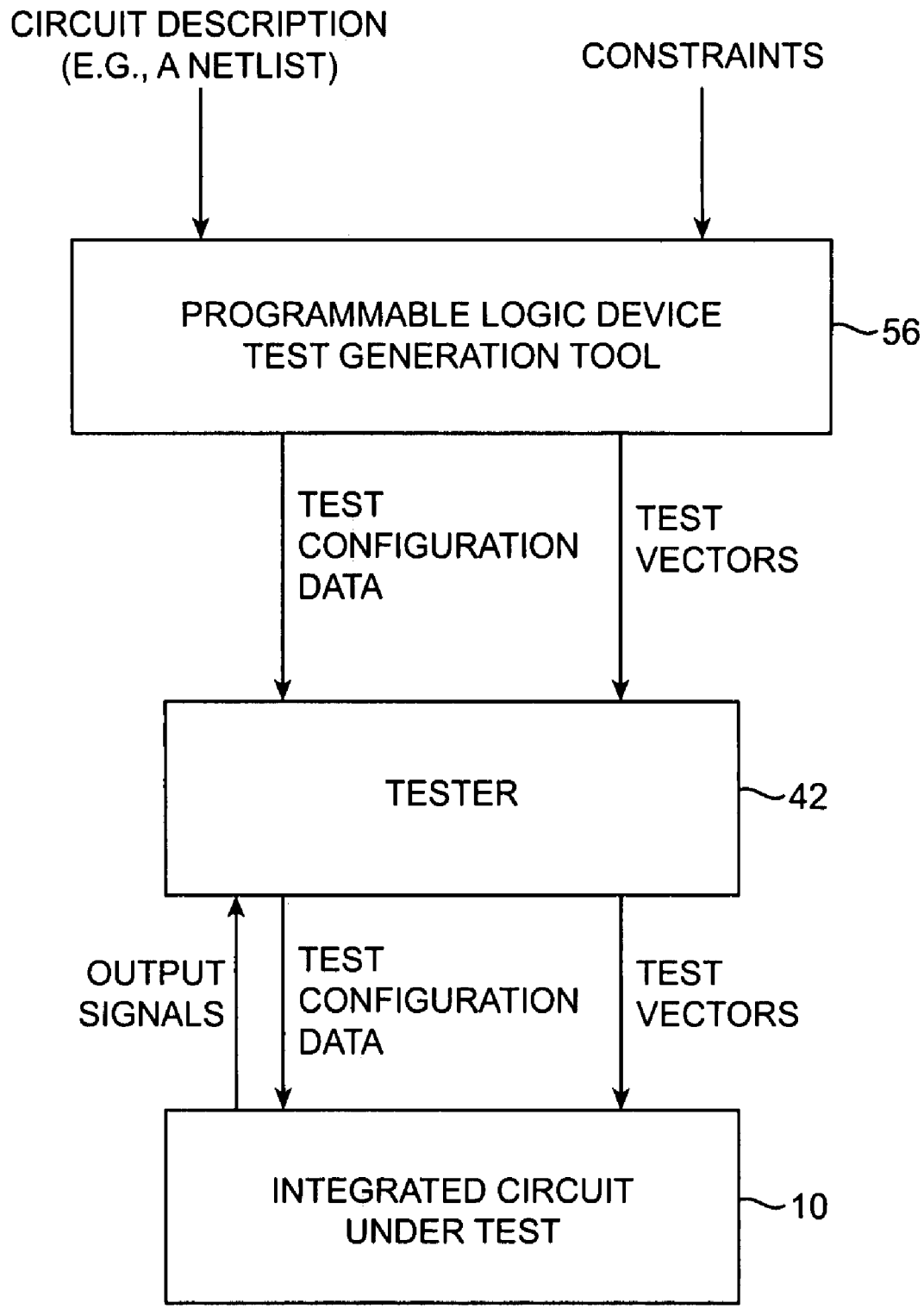
FIG. 6 is a diagram showing how a programmable logic device test generation tool supplies a tester with test configuration data and test vectors for testing an integrated circuit in accordance with the present invention.

The test configuration data and test vectors that are used to test a given programmable logic device are generated using a programmable logic device test generation tool 56, as shown in FIG. 6. Tool 56 preferably has software that is implemented using a single computer, a group of networked computers, or other suitable hardware platform. The hardware used to run the software of tool, 56 may include hard drives, memory, and other computer-readable storage media on which the software (code) for tool 56 is stored. The software for tool 56 may be run using microprocessors or other suitable processing circuitry in the hardware of tool 56.

As shown in FIG. 6, programmable logic device test generation tool 56 may be provided with a netlist of other circuit description of the programmable logic device integrated circuit 10 that it is desired to test. The circuit description may be provided to tool 56 using a hardware description language such as Verilog hardware description language (HDL). The programmable logic device test generation tool 56 is also provided with testing constraints. The information on constraints that is provided to tool 56 may include, for example, information on timing constraints, information on which I/O pins are available to be used during testing, information on which circuits have already been tested elsewhere and are therefore not to be tested, information on which circuits must be tested in a packaged circuit tester such as tester 42 of FIG. 5 and which circuits may be tested in an unpackaged tester such as tester 42 of FIG. 4, and other testing constraints.

The programmable logic device test generation tool 56 uses the circuit description and constraints to produce the test configuration data and test vectors and provides the test configuration data and test vectors to tester 42, as shown in FIG. 6. Any suitable communications arrangement may be used by tool 56 to provide the test configuration data and test vectors to tester 42. For example, tool 56 and tester 42 may communicate over a communications network such as a local area network or wide area network (e.g., the internet). Tool 56 may also store the test configuration data and test vectors for tester 42 on a storage media that is manually transferred to tester 42.

Regardless of how the test configuration data and test vectors are transferred to tester 42 from tool 56, the tester 42 preferably programs the programmable logic device 10 under test using the test configuration data, applies the test vectors, and monitors the resulting output signals, as shown in FIG. 6. This process is repeated until testing is complete. By using appropriate sets of test configuration data and appropriate corresponding sets of test vectors, device 10 can be tested extensively in a reasonable amount of time.

Test vectors may be applied to device 10 using I/O pins (pads). For example, test signals may be applied to certain input pins by tester 42. Test vectors may also be applied to the logic of programmable logic device 10 by loading the test vectors into the circuitry of the programmable logic device through I/O pins or a scan chain formed from a series of linked registers. Scan chains may also be used to capture the results of a test.

Figure 7:
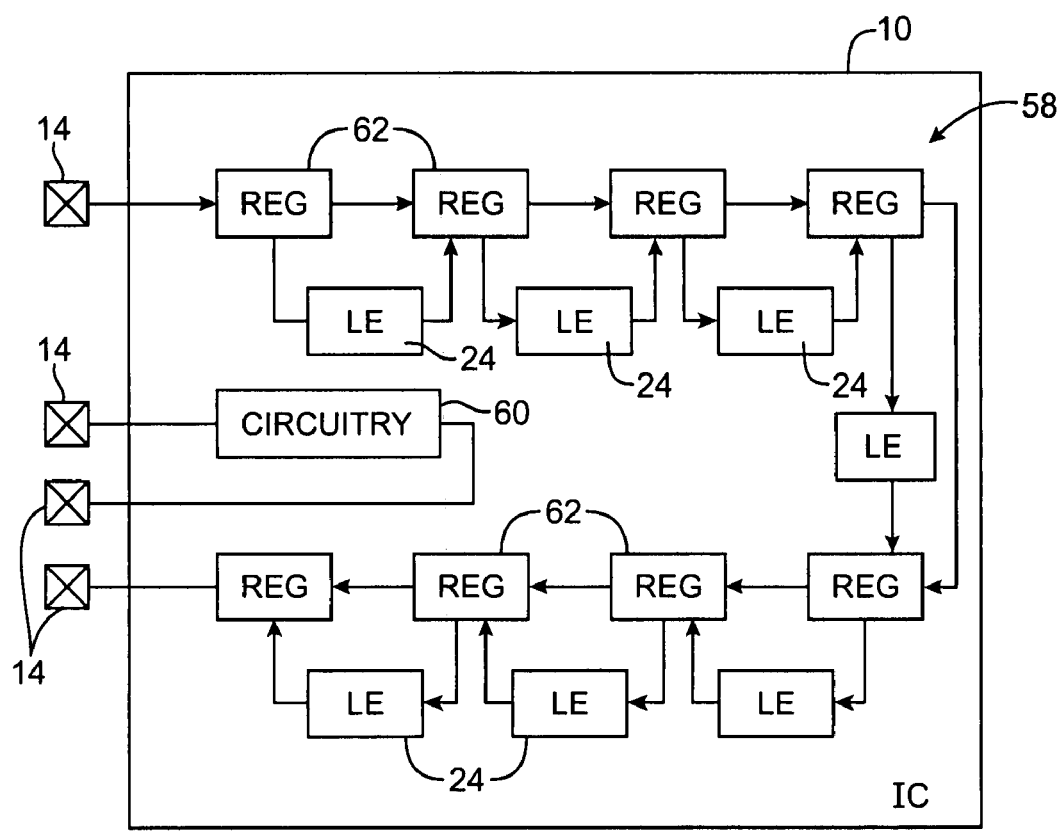
FIG. 7 is a diagram of an illustrative programmable logic device having a scan chain of registers for use during testing operations in accordance with the present invention.

An illustrative programmable logic device 10 with a scan chain 58 is shown in FIG. 7. During testing, test vectors can be applied to internal circuitry 60 of device 10 and resulting output signals can be monitored through pins 14. Test vectors can also be applied to the circuitry of device 10 through the registers 62 of scan chain 58. For example, test vectors can be applied to circuitry such as logic elements 24 by setting a scan chain enable signal to a logic "high" and using a clock signal to load the test vectors into scan chain 58 through pins 14. Scan chains such as scan chain 58 may also be used to capture signals from the circuitry of device 10 during testing. For example, the scan chain enable signal can be set to a logic "low" value to capture the outputs from logic elements 24 or other result data from a test. The clock signal can then be used to scan out the data through the pins 14 that has been captured in the scan chain registers.

The programmable logic device test generation tool 56 (FIG. 6) uses circuit description and constraint data to produce test configuration data and test vectors that tester 42 uses to test device 10. To thoroughly test device 10, the test generation tool 56 uses the circuit description to produce a graph G of the circuitry of device 10. Any suitable format may be used in producing the graph G. With one suitable arrangement, circuit components such as programmable logic elements 24, registers, I/O pins 14, and fixed interconnects 16 are represented by nodes in the graph. Programmable interconnects (e.g., parts of multiplexers or other programmable connections between fixed interconnects) are represented by edges in the graph.

Figure 8:
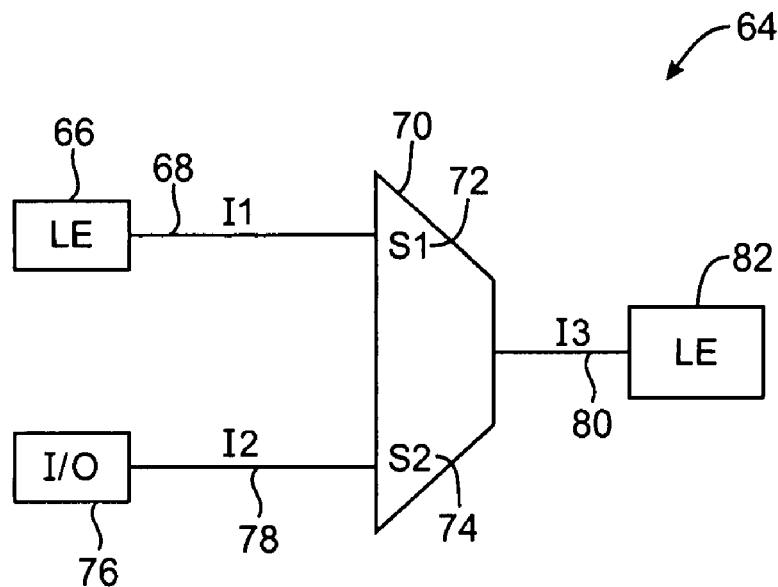
FIG. 8 is a diagram of an illustrative circuit that may be represented using a graph in accordance with the present invention.

A circuit diagram of a illustrative circuit on a programmable logic device is shown in FIG. 8. A graphical representation of the circuit of FIG. 8 is shown in FIG. 9.

Circuit 64 of FIG. 8 has logic elements 66 and 82, multiplexer 70, I/O pin (pad) 76, and fixed connections 68, 78, and 80. Fixed interconnections such as interconnects 68, 78, and 80 are conductive paths on the programmable logic device integrated circuit. Multiplexer 70 is formed from two programmable connections S1 and S2, as shown by reference numbers 72 and 74. When programmable connection S1 is formed, interconnect I1 is electrically connected to interconnect I3. When programmable connection S2 is formed, interconnect I2 is electrically connected to interconnect 13. Configuration data stored in programmable elements 20 (FIG. 1) controls whether the programmable connections S1 and S2 are formed. For example, the configuration data may program multiplexer 70 so that logic element 66 is connected to logic element 82 or different configuration data may program multiplexer 70 so that I/O pin 76 is connected to logic element 82.

Figure 9:
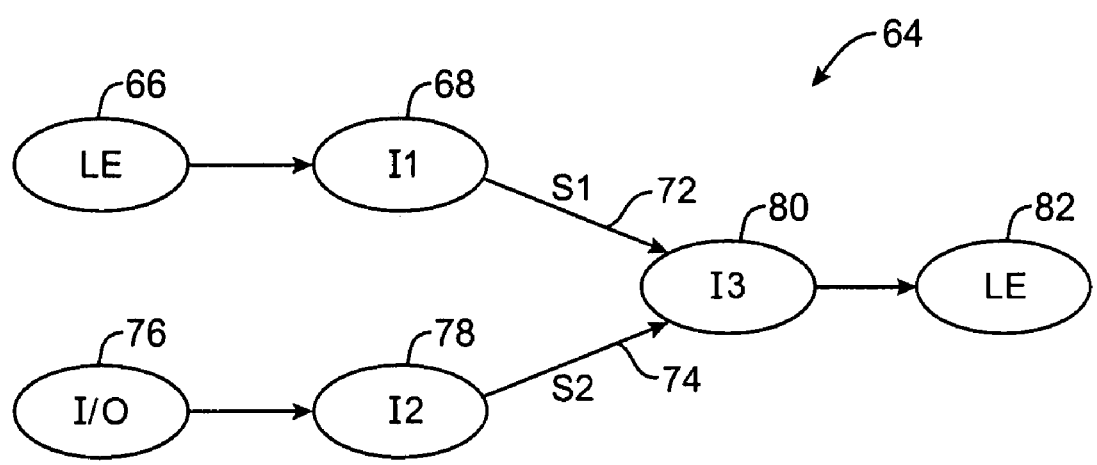
FIG. 9 is a graphical representation of the circuit of FIG. 8 in accordance with the present invention.

Given a circuit description (e.g., a netlist description) of circuit 64 of FIG. 8, test generation tool 56 produces the graphical representation G of circuit 64 that is shown in FIG. 9. In the graph of circuit 64 that is shown in FIG. 9, circuit components such as logic elements 66 and 82, input/output pin 76, and fixed interconnects 68, 78, and 80 are represented by nodes. Programmable interconnects such as S1 and S2 are represented by graph edges 72 and 74. Edges are also used to represent hardwired connections (e.g., the hardwired connection between logic element 66 and fixed interconnect 68). By using the graph G of circuit 64, an automatic test generation tool can efficiently produce test configuration data and test vectors for testing circuit 64.

Figure 10:
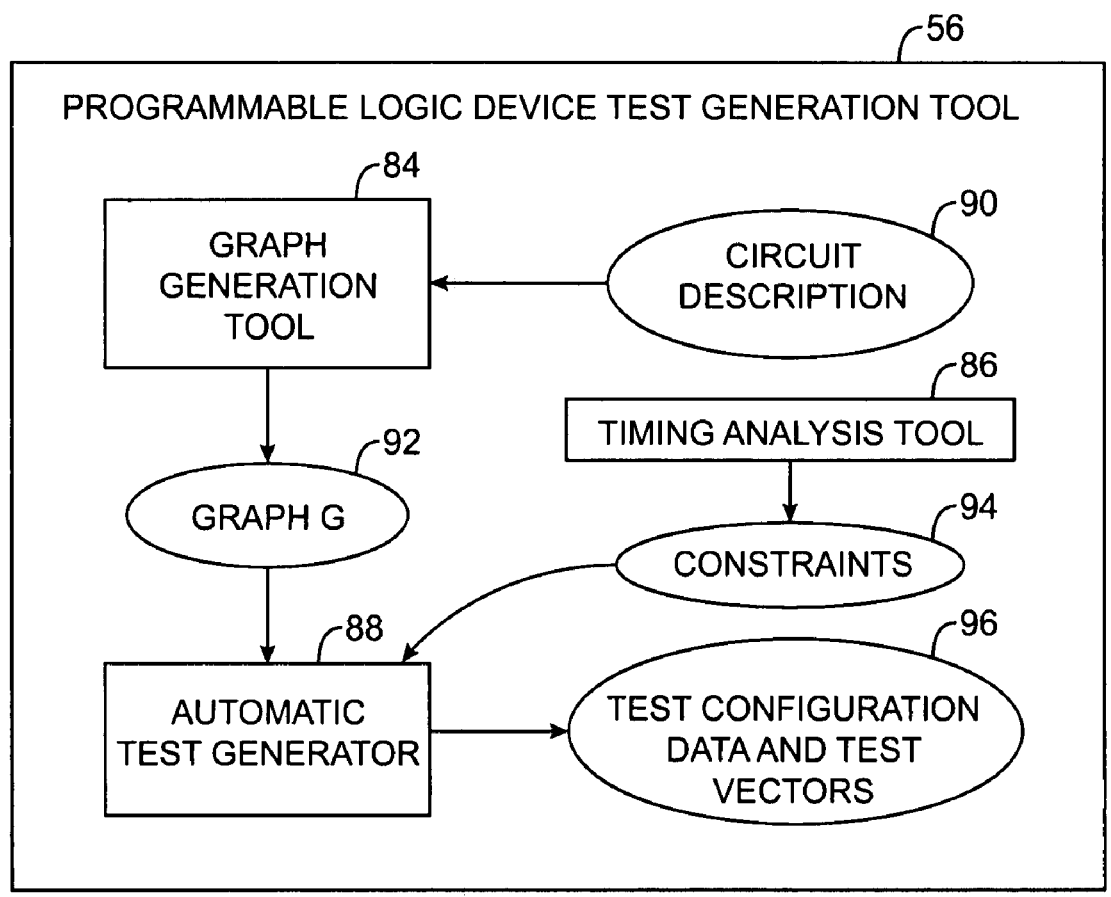
FIG. 10 is a diagram showing components of a programmable logic device test generation tool in accordance with the present invention.

FIG. 10 shows how test generation tool 56 may have a graph generation tool 84, a timing analysis tool 86, and an automatic test generator 88. Graph generation tool 84 may convert a circuit description 90 into a graph G (92). The tool 84 may, for example, convert a netlist description or other suitable description of circuit 64 of FIG. 8 into a graph G for circuit 64 that has nodes and edges of the type shown in FIG. 9.

Timing analysis tool 86 may be used to perform timing computations on paths in the circuit to be tested. For example, timing analysis tool 86 may use relatively simple timing-estimation techniques such as those based on counting the number of interconnect segments or programmable connections between two respective valid test endpoints in a circuit (e.g., two logic elements, etc.) With this type of approach, a path in the circuit that contains 4 segments or programmable connections would be predicted to exhibit less delay than a path that contains 5 similar conductive segments or programmable connections. As another example, timing analysis tool 86 may use more sophisticated timing-estimation techniques such as those that take into account the lengths of various interconnect segments, the capacitances of programmable and fixed interconnects, etc. By taking into account these delay contributions, tool 86 may more accurately predict how much delay will be associated with various paths through the circuit.

Regardless of the particular timing-estimation technique used by timing analysis tool 86, the delay predictions made by the timing analysis tool 86 can serve as constraints 94 that affect whether or not particular paths are to be used as test paths when testing the programmable logic device integrated circuit. For example, if the registers in a programmable logic device scan chain require at least 100 ps of hold time to reach a valid data state, potential test paths that timing analysis tool 86 predicts will have delays of less than 100 ps will not be able to terminate on a scan chain register. The scan chain registers therefore cannot serve as valid starting or ending points for a test path. As another example, if the worst case clock skew between any two registers is predicted to be 200 ps, then no path having less than a 200 ps delay will be allowed between those two registers. Timing constraints and other constraints 94 are used by the automatic test generator 88 when processing graph G to produce test configuration data and test vectors 96 to ensure that tests will be properly performed.

Constraints 94 may include constraints such as timing constraints (e.g., settling time and hold time constraints), constraints indicating which edges in a graph are available to be tested, which registers are available to be used in a test, which I/O pins are available, which circuits may have been eliminated from a test as being unnecessary to test because they are tested elsewhere, which circuitry is unavailable for testing because it requires that the device 10 be mounted in an integrated circuit package, or any other suitable testing constraints. To thoroughly test the programmable logic device integrated circuit, automatic test generator 88 processes graph G in multiple sessions. For each session, automatic test generator 88 processes a different testable subgraph TSG of graph G. Each testable subgraph is extracted from graph G by applying a different set of associated constraints 94. Complete testing may be achieved by selecting appropriate constraints for each session. Automatic test generator 88 may use any suitable test generation algorithm to produce test configuration data and test vectors from the subgraphs. The test generation algorithm analyzes the subgraph and determines which logic configurations and test signals are required to test the interconnects and other components requested by the subgraph. As each subgraph TSG is processed by automatic test generator 88, a different set of test configuration data and test vectors is produced. The union of these sets of test configuration data and test vectors forms test configuration data and test vectors for testing the entire graph G and therefore the entire programmable logic device integrated circuit 10.

Figure 11:
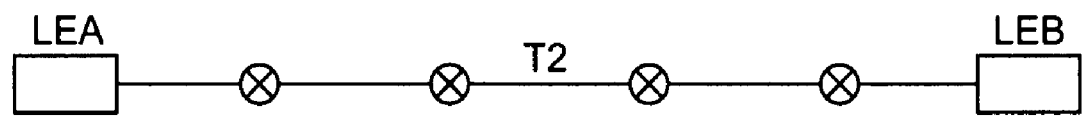
FIG. 11 is a circuit diagram showing a fixed interconnect T2 that lies on a relatively long test path between test endpoints in accordance with the present invention.

Automatic test generator 88 varies which test constraints are being used in each session so that the extracted subgraphs each cover a different portion of G and so that the coverage achieved by all of the extracted subgraphs covers graph G thoroughly. Consider, for example, the illustrative circuit of FIG. 11. Suppose that it is desired to test interconnect T2. To test interconnect T2, test data can be loaded into logic element LEA. If interconnect T2 is functioning properly (i.e., if T2 is not shorted to a source of fixed potential and is not an open circuit), the test data that is in programmable logic device logic element LEA will propagate to logic element LEB. A register or other suitable data storage logic in logic element LEB may be used to capture the test signal applied at LEA, provided that the applicable test constraints 94 are satisfied. In this example, suppose that a valid test path between respective logic elements must contain four or more interconnect segments to ensure that the path delay is sufficient for the logic elements to function properly. Because the path between logic element LEA and logic element LEB has five interconnect segments, this constraint 94 is satisfied and the path between LEA and LEB that is shown in FIG. 11 may be used during testing. Automatic test generator 88 may therefore generate test configuration data and test vectors that create the circuit path of FIG. 11, so that test segment T2 can be tested by sending test signals from LEA to LEB. The captured signals from this test may be analyzed to determine whether T2 is functioning properly.

Figure 12:
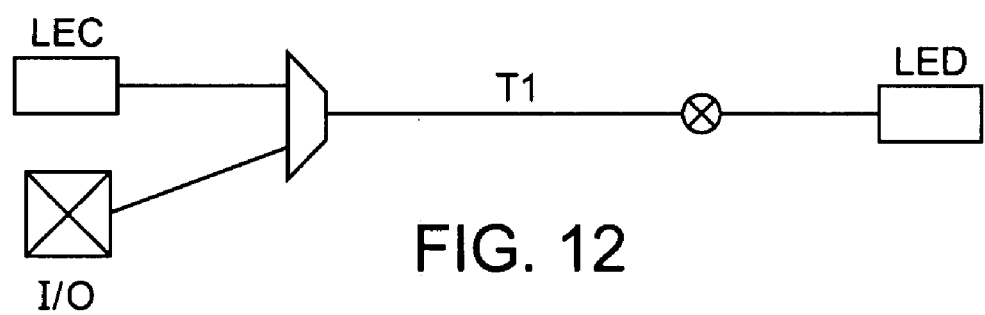
FIG. 12 is a circuit diagram showing a fixed interconnect T1 that lies on a relatively short test path between two sets of potential test endpoints in accordance with the present invention.

In the example of FIG. 11, the timing constraint regarding test paths between logic element endpoints was satisfied by the test path circuit between LEA and LEB, so a path of this type could be included in an extracted subgraph when the timing constraint is applied. In the example of FIG. 12, this timing constraint would not be satisfied for the path between logic element LEC and logic element LED, because this path between logic element endpoints contains only three interconnect segments. As a result, the path between LEC and LED may not be included in an extracted subgraph when the timing constraint is applied by generator 88 and may not be used to test interconnect segment T1. However, in the example of FIG. 12, another possible test path exists. In particular, a potential test path between an I/O pad (IO) and logic element LED exists. This path contains only three interconnect segments, but the four-segment timing constraint in this example only applies to test paths between respective logic elements. Because IO is an I/O pad and not a logic element, the path between IO and logic element LED in FIG. 12 satisfies the timing constraint and may be used to test segment T1, provided that the test constraints 94 also allow IO pads to be used in test paths in place of logic elements.

In this example, generator 88 uses a set of test constraints that do not allow I/O pads to be used in test paths during a first processing session. Only logic elements may be used. Accordingly, the automatic test generator 88 cannot create any test paths for the circuit of FIG. 12 during the first session. The test path between LEC and LED violates the logic-element-to-logic-element timing constraint and the test path between IO and LED violates the logic-element-only constraint. However, during a second session, automatic test generator 88 varies the constraints 94 that are used. In particular, during the second session the automatic test generator 88 does not include the logic-element-only constraint. As a result, input-output pins such as IO are included in potential test paths. The path between IO and LED does not violate the timing constraint, because IO is not a logic element and is permitted because I/O pins can be included in test paths under the constraints in place for the second processing session. During the second processing session, the automatic test generator 88 therefore generates test configuration data and test vectors that test the path between IO and LED. During subsequent testing operations with the programmable logic device integrated circuit tester, test signals are applied to the I/O pad and are monitored at logic element LED. If the signals received at logic element LED match the test signals applied at IO, it can be concluded that the interconnect segment T1 is operating properly.

As this example demonstrates, automatic test generator 88 can vary the test constraints that apply for a given session to make it possible to test circuitry that would otherwise not be testable. Automatic test generator 88 preferably ensures that the test constraints that are applicable for each processing session are different. Varying the constraints in this way allows the automatic test generator 88 to thoroughly test the graph G associated with a programmable logic device integrated circuit by extracting multiple subgraphs and processing them in multiple sessions.

Figure 13:
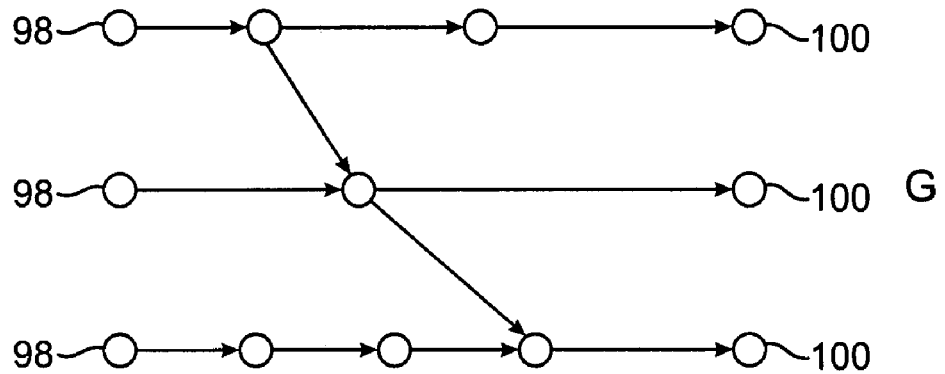
FIG. 13 is a graph G of an illustrative circuit to be tested in accordance with the present invention.
Figure 14:
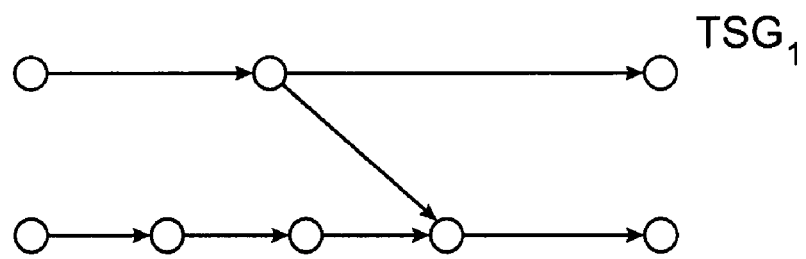
FIG. 14 is a testable subgraph that has been extracted from the graph of FIG. 13 in accordance with the present invention.
Figure 15:
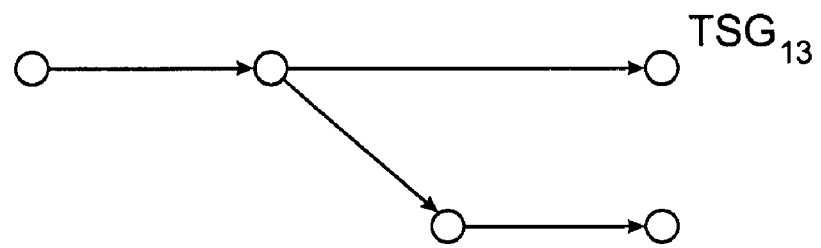
FIG. 15 is a subgraph (subset) that has been extracted from the testable subgraph of FIG. 14 in accordance with the present invention.

The process of applying test constraints to determine which portion of a graph G is to be processed by automatic test generator 88 is shown in FIGS. 13, 14, and 15. An illustrative graph G is shown in FIG. 13. The graph G has three possible starting endpoints 98 (start points) at which test data can be applied. The graph G also has three possible ending endpoints 100 at which resulting test data can be captured.

Automatic test generator 88 (FIG. 10) processes graph G in multiple sessions. During each session, a testable subgraph TSG is extracted from G and is processed using an automatic test generation algorithm to produce configuration data and test vectors. An illustrative testable subgraph $TSG_1$ that may be processed during a first processing session is shown in FIG. 14. In the example of FIG. 14, the node associated with one of the potential starting points was eliminated as not satisfying the constraints applicable to the first processing session (e.g., because the eliminated node corresponded to an I/O pin and not a logic element as required by the set of constraints applicable to the first processing session). As a result, this node and its associated downstream edges and nodes were not included in subgraph $TSG_1$. The subgraph $TSG_1$ is smaller in size than graph G. It is therefore easier and more efficient to process $TSG_1$ to produce appropriate test configuration data and test vectors than it is to process graph G.

If desired, a cost function may be used to evaluate how to process subgraphs such as $TSG_1$. With this type of approach, the automatic test generator may enforce restrictions on which edges are to be included in the subgraph during processing. As an example, the automatic test generator may compute a cost function C for each edge in the subgraph and may compare this value to a cost threshold Cth to determine whether that edge should be included as part of the testable subgraph. The value of the cost function threshold may be incremented or decremented in successive iterations to allow larger or smaller subgraphs to be included.

An example of a suitable cost function is a cost function that imposes costs based on path lengths. When this type of cost function is used, subgraphs such as $TSG_1$ may be processed in an iterative fashion in which paths of successively larger size (e.g., larger numbers of programmable and/or fixed interconnects) are included in the test path search. Iterative processing helps to avoid situations in which subgraph processing is terminated before it has been adequately completed due to excessively long processing times. With one suitable iterative approach, the permissible number of programmable interconnects (and therefore the number of associated fixed interconnect segments) in a test path (the number of "hops" represented by a hop number index) is increased in each iteration. A first iteration may, as an example, permit three hops. In this iteration, the portion of the testable subgraph $TSG_1$ of FIG. 14 that is processed is the sub-sub-graph $TSG_{13}$ that is shown in FIG. 15. As shown in FIG. 15, the sub-graph $TSG_{13}$ includes a subset of the nodes and edges of testable subgraph $TSG_1$ of FIG. 14. In $TSG_{13}$, all of the nodes and edges in paths that involve four or more hops have been eliminated from $TSG_1$ and are not processed during the three-hop interaction. The only paths remaining in $TSG_{13}$ have three or fewer graph edges. During subsequent processing iterations, four hops, five hops, and successively larger numbers of hops may be permitted in potential test paths (if desired). By increasing the maximum number of edges that are allowed between the start and end point of a valid test path in this way, the size of the subsets of $TSG_1$ that are processed are successively increased until a satisfactory portion of testable subgraph $TSG_1$ has been processed. The use of a cost function based on a hop number index is merely illustrative. In general, any suitable cost function may be used to determine which portions of the testable subgraph should be processed. As another example, a cost function approach may be used in which the automatic test generator probabilistically selects an edge in a given iteration if it has already been tested in a previous iteration.

As the example of FIGS. 13, 14, and 15 demonstrates, when generating test configuration data and test vectors to test a programmable logic device integrated circuit 10, automatic test generator 88 processes the graph G of the circuit in multiple sessions. Each session has a different set of associated constraints 94, so that a different testable subgraph of G is processed in each session. Iterative processing may be used to process each subgraph. FIG. 16 is a table showing illustrative constraints associated with each of two illustrative processing sessions. In a first processing session, test generator 88 uses the constraints shown in the first row of the table of FIG. 16 to extract a first subgraph from G and by processing this subgraph produces a first set of test configuration data and test vectors. In a second processing session, test generator 88 uses the constraints shown in the second row of the table of FIG. 16 to extract a second subgraph from G and by processing this subgraph produces a second set of test configuration data and test vectors. Subsequent sessions (not shown) use different sets of constraints and produce additional test configuration data and test vectors. The cost function C can be used to produce the sets of constraints that are used to extract the subgraphs from G. The aggregate (union) of the test configuration data and test vectors produced in connection with each subgraph is a global set of test configuration data and test vectors for use by a tester to thoroughly test the programmable logic device integrated circuit represented by graph G.

As shown in column A of the first row in the table of FIG. 16, the first set of constraints specify that a subset of the edges of graph G are available for testing in the first session. The subset of the edges that are available is determined by a timing analysis performed by timing analysis tool 86 (FIG. 10). If, for example, certain paths have delays that are too short, the edges of the graph G that are associated with those paths are not available to be included in a possible test path. Column B in the first row of the FIG. 16 table shows that an applicable timing constraint requires that there be more than a 100 ps delay between valid test path endpoints. As shown in column C of the first row, no I/O pins are allowed to be used as endpoints in the test paths of the testable subgraph associated with the first session. Column D indicates that no circuitry in the programmable logic device integrated circuit associated with the graph G has been eliminated as being not necessary to test. If some of the circuitry of graph G was tested elsewhere (e.g., using different test equipment), it would not be necessary to retest the associated portion of graph G during session 1. Column E shows that none of the circuits in graph G require that the device 10 be packaged prior to testing. Such packaging requirements may apply to high-speed circuits or other circuits that require low noise environments for proper testing. Session 1 of FIG. 16 may correspond to a testable subgraph $TSG_1$ in which a particular portion of the circuit of graph G (e.g., an interconnect such as interconnect T1 of FIG. 12) is not available for testing because T1 is not contained in a path that satisfies the I/O pin availability, timing constraints, and other criteria of row 1. To test interconnect T1 during the second processing session, automatic test generator 88 produces a second testable subgraph $TSG_2$ from graph G that includes T1. Subgraph $TSG_2$ is produced from graph G by generator 88 by applying the constraints of row 2. The constraints of row 2 are different from the constraints of row 1. In particular, the constrains of row 2 allow a subset of I/O pins (such as I/O pin IO of FIG. 12) to be used as valid end points in the test paths of the subgraph, as shown in the second row of column C of FIG. 16. As a result of changing this constraint, subgraph $TSG_2$ includes T1. It is therefore possible to test the edge T1 with the test configuration data and test vectors that are produced by generator 88 during session 2.

In session 1, testable subgraph $TSG_1$ of graph G is processed. In session 2, testable subgraph $TSG_2$ of graph G is processed. Additional processing sessions may be used for processing additional subgraphs of graph G until sufficient test coverage has been obtained.

Figure 17:
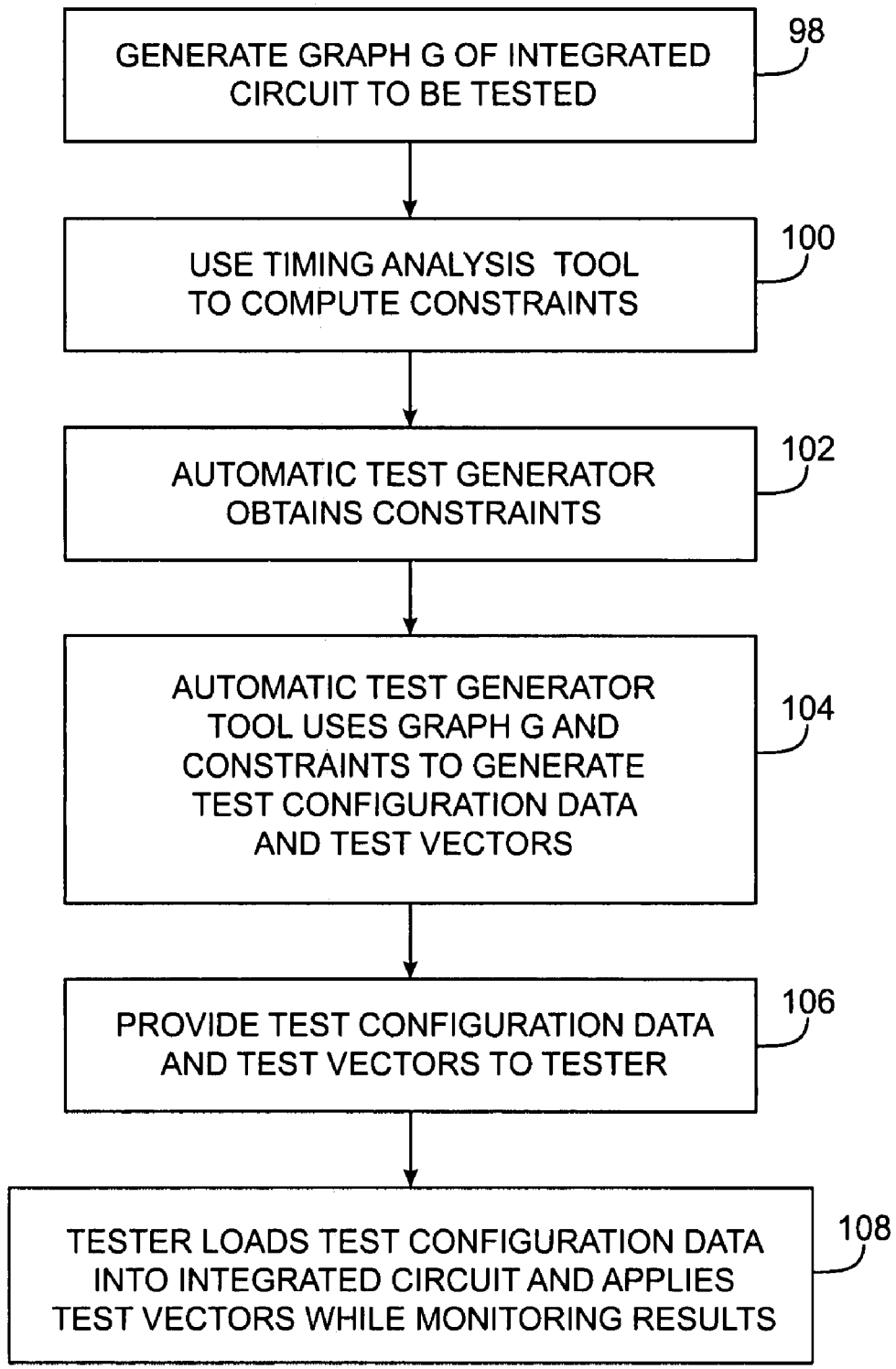
FIG. 17 is a flow chart of illustrative steps involved in generating test configuration data and test vectors for testing a programmable logic device integrated circuit in accordance with the present invention.

Illustrative steps involved in testing programmable logic device integrated circuit 10 are shown in FIG. 17.

At step 98, the graph generation tool 84 of FIG. 10 uses circuit description 90 to generate a graph G of the programmable logic device integrated circuit 10 that is to be tested. The circuit description may be provided in any suitable format. For example, the circuit description may be provided in a hardware description language such as Verilog hardware description language (HDL) or Very High Speed Integrated Circuit Hardware Description Language (VHDL). The circuit description specifies which circuit components are contained in the programmable logic device integrated circuit. During step 98, the graph generation tool 84 converts the circuit description 90 into a graphical representation of the programmable logic device integrated circuits, as described in connection with FIGS. 8 and 9. The graphical representation of the programmable logic device integrated circuit is a graph G in which nodes represent circuit components such as programmable logic elements, registers, I/O pins, and fixed interconnects and edges represent programmable connections (e.g., transistor-based switches that can be controlled to form electrical connections or to form open circuits in response to control signals from associated programmable elements 20).

Automatic test generator 88 of FIG. 10 processes the graph G to produce test configuration data and test vectors 96. The constraints 94 that are selected by automatic test generator 88 impose limitations on which test paths are possible, which in turn defines the size of the subgraph that is extracted in each processing session. Some constraints may result from studies that have been made on the requirements of the various circuit components in programmable logic device integrated circuit 10. For example, theoretical and/or empirical evaluations may be made on the circuitry of programmable logic device integrated circuit 10 to determine its characteristics. If, as an example, it is determined that registers in circuit 10 have particular hold time and settling time requirements, those requirements can be made part of constraints 94. If, as another example, it is determined that the testing environment provided by an unpackaged integrated circuit tester such as tester 42 of FIG. 4 is too noisy for testing certain sensitive circuits, the requirement that those sensitive circuits be tested in a packaged environment such as the packaged circuit tester 42 of FIG. 5, that requirement can be made a part of constraints 94. Still other constraints can be generated by performing timing analysis with timing analysis tool 86 of FIG. 10. The timing analysis tool 86 may, for example, use circuit description 90 or other information on the circuitry of the programmable logic device integrated circuit to compute the delays associated with different types of paths through the integrated circuit. This timing analysis information can be made a part of constraints 94 (e.g., to determine which parts of graph G are available to be included in the processing of graph G by automatic test generator 88). The optional use of timing analysis tool 86 to generate some of the constraints 94 of FIG. 10 is shown by step 100 in FIG. 17. Constraints 94 may be stored in a database maintained by tool 56 or using any other suitable storage arrangement.

At step 102 of FIG. 17, the automatic test generator 88 of tool 56 obtains constraints 94 (e.g., by retrieving constraints from a database).

At step 104, the automatic test generator 88 uses graph G and constraints 94 to generate corresponding test configuration data and test vectors 96. During step 104 automatic test generator 88 processes graph G in multiple sessions. During each session, automatic test generator 88 processes a different testable subgraph TSG of graph G. Each subgraph processing operation involves a different set of constraints 94 and produces a different set of test configuration data and test vectors. When processing sessions are complete and most or all of graph G has been processed, the combined set of test configuration data and test vectors may be provided by tool 56 to tester 42 (step 106). Because most or all of graph G has been processed, the combined set of test configuration data and test vectors can be used to thoroughly test the programmable logic device integrated circuit described by circuit description 90 and graph G (92).

At step 108, the tester 42 loads the test configuration data into the programmable logic device integrated circuit 10 to configure the device 10 for testing. The test vectors are then applied to the programmed device and the resulting signals generated during operation of the device are monitored by the tester. After all test vectors have been applied and their results monitored for a particular set of test configuration data, the tester loads another set of test configuration data into the device 10. This process continues until all desired sets of test configuration data and corresponding sets of test vectors have been used.

Figure 18:
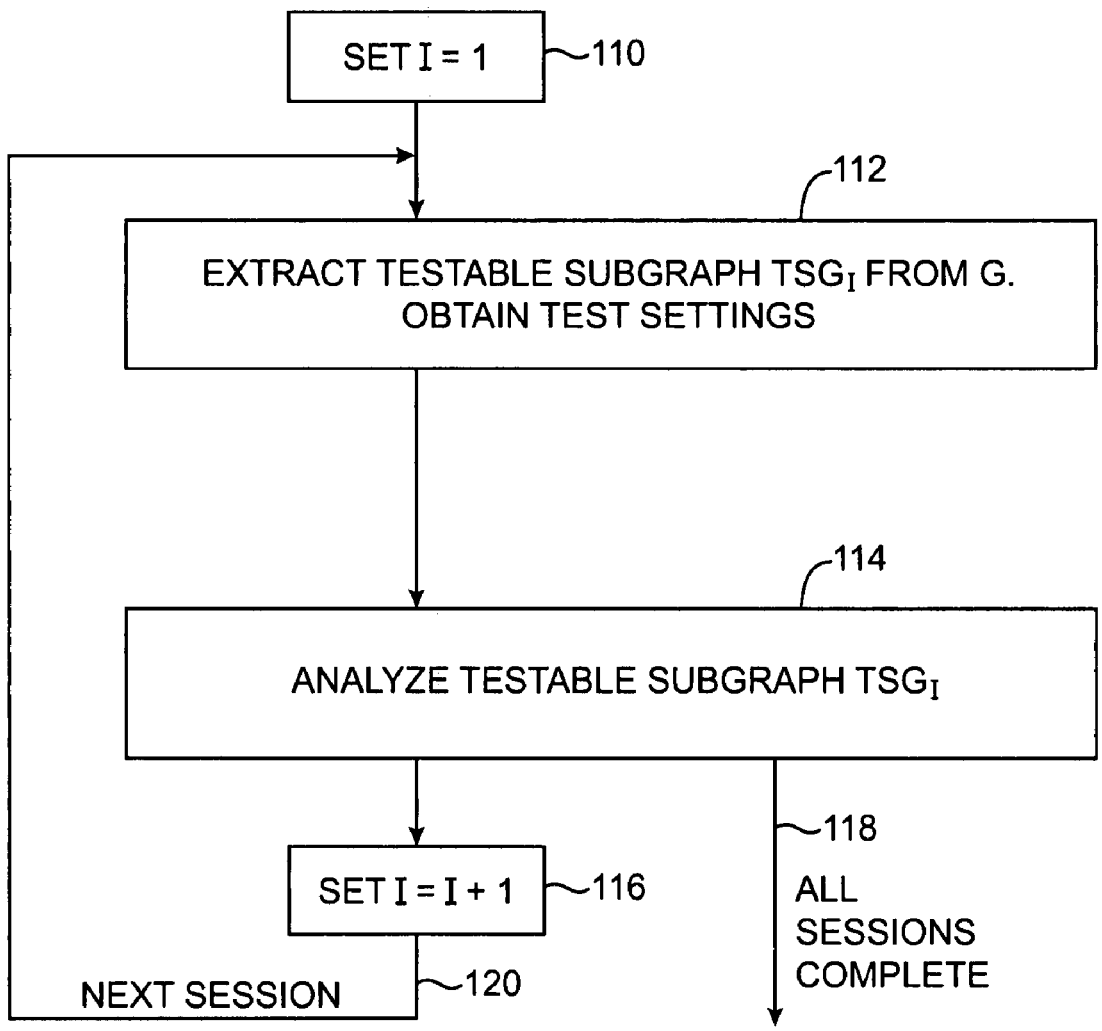
FIG. 18 is a flow chart of steps involved in processing a graph of a circuit to be tested in multiple sessions each of which is associated with a subgraph extracted from the graph in accordance with the present invention.

Illustrative steps involved in using automatic test generator 88 to process graph G in multiple sessions are shown in FIG. 18. In the operations of FIG. 18, an index I is used. The value of I is 1 for the first session, 2 for the second session, 3 for the third session, etc.

At step 110, the index I is initialized at 1.

At step 112, the automatic test generator 88 extracts a testable subgraph $TSG_I$ from G. Automatic test generator 88 applies appropriate test constraints 94 in extracting $TSG_I$ from G. Various settings are used by automatic test generator 88 when processing graph G. For example, settings related to the cost function C and cost function threshold Cth are used. If a cost function C is used that is based on a hop number index H, settings such as an incremental hop value setting ΔH may be used to specify how many graph edges (hops) may be included in the possible test paths in each iteration when an iterative processing scheme is used to analyze testable subgraphs. Settings may be used to define a saturation threshold value $S_T$, target test coverage value, or other suitable parameters that are used to evaluate completion of subgraph processing, etc. These settings may be obtained by the automatic test generator 88 at step 112 (e.g., from a database maintained by tool 56). If desired, the test settings obtained at step 112 may be input by a user of the tool 56 using a suitable graphical user interface.

At step 114, the automatic test generator 88 may analyze the testable subgraph $TSG_I$ to produce corresponding test configuration data and test vectors 96. During the subgraph processing operations of step 114, the cost function C and cost function threshold Cth may be used to vary the portion of the extracted testable subgraph that is processed. For example, the threshold Cth may be increased in an iterative fashion to incrementally enlarge the size of the search space in the extracted testable subgraph. If a cost function based on a hop number index is used, processing at step 114 may use an iterative approach in which the number of allowable hops (edges) in the test paths being analyzed in the subgraph $TSG_I$ are increased in succession (e.g., by incrementing a hop number index H by the hop value ΔH obtained at step 112).

If the subgraph being processed at step 114 is the last subgraph to be processed (e.g., because all or most of graph G has been processed), further processing is halted, as indicated by line 118. If another subgraph is to be processed, the value of the index I is incremented by one at step 116. As indicated by line 120, processing then loops back to step 112 and the next testable subgraph $TSG_I$ is extracted from graph G in the next subgraph processing session.

Figure 19:
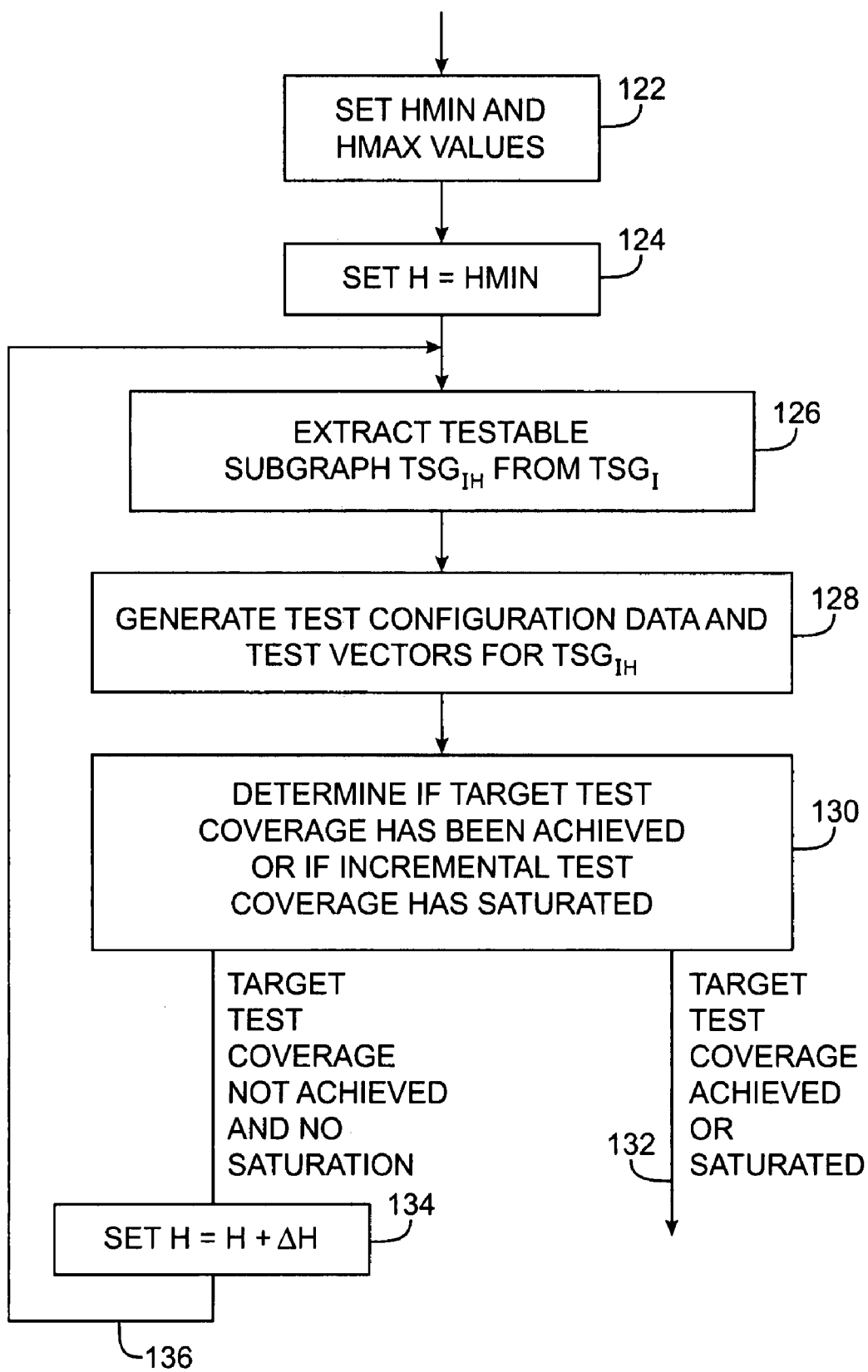
FIG. 19 is a flow chart of steps involved in iteratively processing the subgraphs of FIG. 18 in accordance with the present invention.

Illustrative steps involved in processing the $I^{th}$ testable subgraph $TSG_I$ of graph G during step 114 of FIG. 18 when a cost function arrangement based on a hop number index is used are shown in FIG. 19. As shown by loop 120 of FIG. 18, the steps of FIG. 19 are repeated each time automatic test generator 88 begins a new processing session and the value I is incremented by one.

The operations of FIG. 19 involved iteratively processing successively greater portions of the testable subgraph $TSG_I$. Initially, only a relatively small portion of $TSG_I$ is processed, because the number of graph edges (hops) is initially low. In successive iterations, the number of permitted edges in a test path is allowed to increase, so increasingly larger portions of testable subgraph $TSG_I$ are processed. The operations of FIG. 19 are terminated when a target amount of test coverage has been reached or when the process has saturated and only minimal improvement is being achieved by additional processing.

Hop number index H may be used to keep track of the number of graph edges that automatic test generator 88 allows to exist in a test path when processing the testable subgraph $TSG_I$. Values of the upper and lower bounds of H (HMAX and HMIN, respectively) are set at step 122. The values of HMAX and HMIN, which may be user-supplied or user-adjusted if desired, may be part of the test settings that are obtained by the automatic test generator 88 during step 112 (FIG. 18).

At step 124, the automatic test generator 88 initializes the value of the hop index H to HMIN.

At step 126, the automatic test generator 88 uses the present value of H to extract a testable subgraph $TSG_{IH}$ from testable subgraph $TSG_I$. $TSG_{IH}$ is a subgraph (subset) of subgraph $TSG_{IH}$, because only some of the possible paths between valid endpoints in the graph $TSG_I$ will, in general, contain H or fewer edges. Because paths that include more than H edges will not be included in $TSG_{IH}$, the graph $TSG_{IH}$ is smaller than $TSG_I$ and includes only that portion of $TSG_I$ that is testable using paths with H or fewer hops.

At step 128, the automatic test generator 88 processes the extracted subgraph $TSG_{IH}$ to generate appropriate test configuration data and test vectors. Any suitable test generation algorithm may be used during step 128. For example, a test generation algorithm may be used that systematically creates test configuration data and test vectors to test each available interconnect segment associated with $TSG_{IH}$. Because $TSG_{IH}$ is significantly smaller than G, the use of relatively exhaustive algorithms that attempt to test every interconnect (or almost every interconnect) in $TSG_{IH}$ is practical. If desired, speed-optimized and less-exhaustive test generation algorithms may be used.

At step 130, after $TSG_{IH}$ has been processed, the automatic test generator 88 determines whether processing of $TSG_I$ is complete. Any suitable technique may be used to determine whether $TSG_I$ has been processed sufficiently. With the illustrative approach used in the example of FIG. 19, two independent metrics are used during step 130.

In a first test performed during step 130, the automatic test generator 88 determines whether or not a sufficient percentage of nodes in $TSG_I$ have been processed. The percentage (fraction) of nodes that have been processed can be compared to a target test coverage value (e.g., a target coverage fraction or percentage) to determine whether sufficient processing has been performed. An example of a target test coverage value is 0.98 (98% coverage). The target test coverage value may be user-defined and may be obtained by the automatic test generator 88 at step 112 of FIG. 18.

In a second test performed during step 130, the automatic test generator 88 determines whether the progress being made in processing $TSG_I$ has saturated. In particular, the automatic test generator 88 can compare the amount of coverage obtained by processing $TSG_{IH}$ to the amount of coverage obtained when processing $TSG_{I(H-\Delta H)}$. If the incremental progress is less than a saturation threshold value $S_T$ (which may be supplied at step 112), the generator 88 may conclude that progress has saturated.

If, at step 130, it is determined that the desired target test coverage has been achieved or that processing progress on $TSG_I$ has saturated, the automatic test generator 88 may proceed to step 116 of FIG. 18, as indicated by line 132 of FIG. 19. At step 116 of FIG. 18, the I index may be incremented so that generator 88 may proceed with the next subgraph processing session.

If, at step 130, it is determined that the target test coverage has not been achieved and that the progress in processing $TSG_I$ has not saturated, the hop number index H may be incremented by ΔH at step 134. The value of ΔH may be small (e.g., 1 or 2) when it is desired to approach larger numbers of hops slowly. Large values of ΔH may be used when it is desired to proceed more rapidly to large path lengths and large numbers of graph edges in the processing of $TSG_I$.

As shown by line 136, after the value of H has been incremented at step 134, processing loops back to step 126, so that automatic test generator 88 can process more of $TSG_I$.

Figure 20:
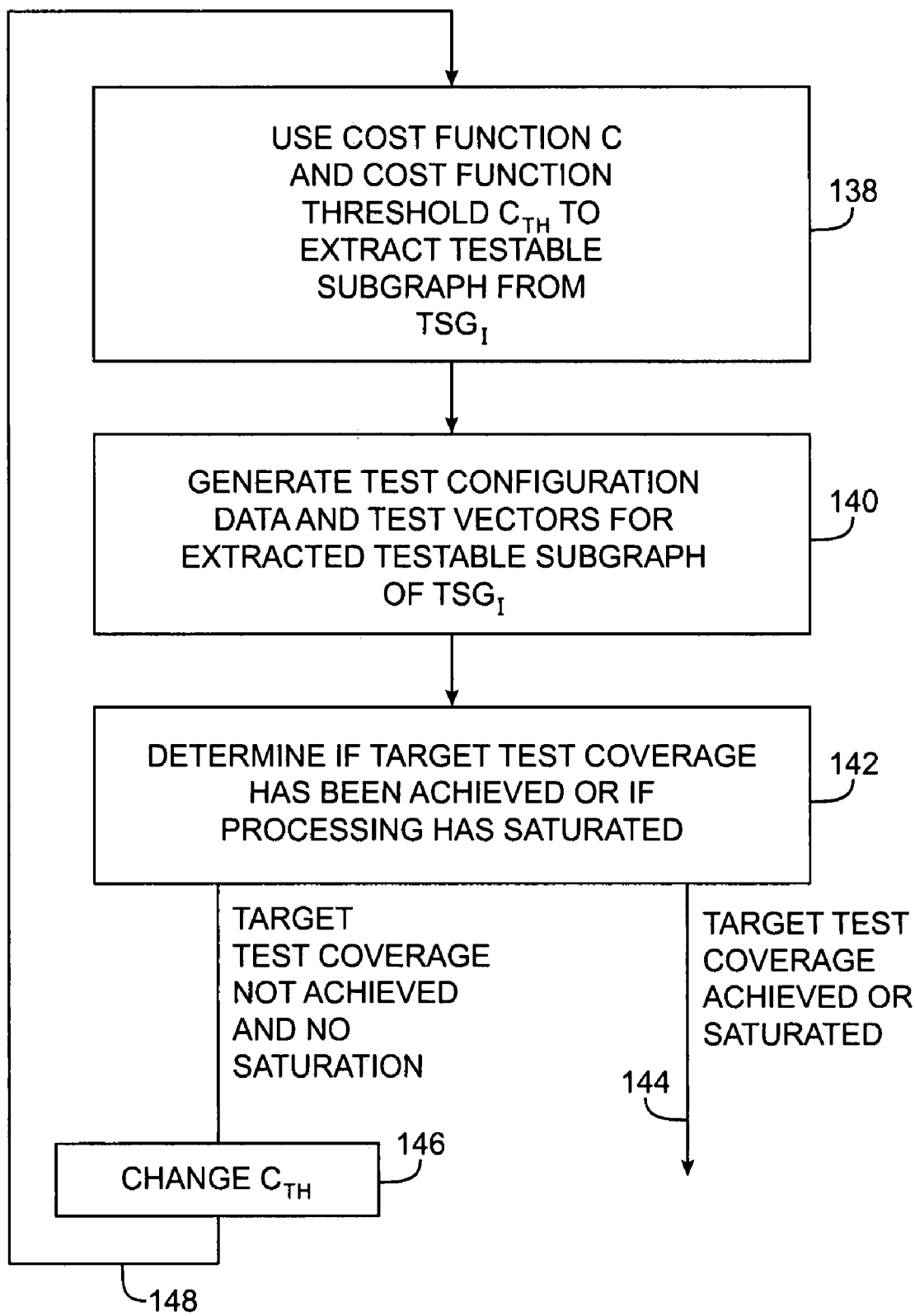
FIG. 20 is a flow chart of steps involved in processing the subgraphs of FIG. 18 by adjusting a cost function threshold in accordance with the present invention.

The use of a cost function based on a hop number index is merely illustrative. In general, any suitable cost function may be used. Illustrative steps involved in processing the $I^{th}$ testable subgraph $TSG_I$ of graph G during step 114 of FIG. 18 when a generic cost function is used are shown in FIG. 20. As shown by loop 120 of FIG. 18, the steps of FIG. 20 are repeated each time automatic test generator 88 begins a new processing session and the value I is incremented by one.

The operations of FIG. 20 involved iteratively processing different portions of the testable subgraph $TSG_I$. Initially, the cost threshold Cth is set to a first value. The cost function is then applied to the testable subgraph $TSG_I$ to determine which portion is less than the threshold and should therefore be included in processing. In successive iterations, Cth is varied (e.g., incremented), so the size of the portion of the testable subgraph $TSG_I$ that is to be processed is allowed to change (e.g., increase). The operations of FIG. 20 can be concluded when sufficient test coverage has been obtained (e.g., when a target amount of test coverage has been obtained) or when the process saturates.

As shown in FIG. 20, at step 138, the cost function and current value of the cost function threshold Cth are used to extract a portion of the testable subgraph $TSG_I$ for processing.

At step 140, test configuration data and test vectors for the extracted portion of $TSG_I$ are generated using a test generation algorithm.

At step 142, after the extracted portion of $TSG_I$ has been processed, the automatic test generator 88 determines whether processing of $TSG_I$ is complete. Any suitable technique may be used to determine whether $TSG_I$ has been processed sufficiently (e.g., using a metric based on what percentage of nodes in $TSG_I$ have been processed, using a processing saturation metric based on the incremental amount of processing performed, etc.).

If, at step 142, it is determined that the desired target test coverage has been achieved or that processing progress on $TSG_I$ has saturated, the automatic test generator 88 may proceed to step 116 of FIG. 18, as indicated by line 144 of FIG. 20. At step 116 of FIG. 18, the I index may be incremented so that generator 88 may proceed with the next subgraph processing session.

If, at step 142, it is determined that the target test coverage has not been achieved and that the progress in processing $TSG_I$ has not saturated, the cost function threshold Cth can be changed (e.g., incremented or decremented) at step 146.

As shown by line 148, after the value of Cth has been changed at step 146, processing loops back to step 138, so that automatic test generator 88 can a new portion of $TSG_I$.

The foregoing is merely illustrative of the principles of this invention and various modifications can be made by those skilled in the art without departing from the scope and spirit of the invention.

What is claimed is:

1. A method for using a programmable logic device test generation tool to generate test configuration data and test vectors for testing a programmable logic device integrated circuit, comprising:
   generating a graph of the programmable logic device integrated circuit with the programmable logic device test generation tool;
   using the programmable logic device test generation tool to automatically extract multiple testable subgraphs from the graph in separate processing sessions;
   processing each extracted testable subgraph in a separate processing session with the programmable logic device test generation tool to produce a corresponding set of test configuration data and test vectors for testing the programmable logic device, wherein the graph and the extracted testable subgraphs contain nodes and edges and wherein the edges represent programmable connections in the programmable logic device integrated circuit; and
   during each procession session, using a cost function to determine which portion of the extracted testable subgraph is to be processed, wherein using the cost function comprises incrementing a cost function threshold in successive processing iterations to selectively increase the portion of the extracted testable subgraph that is processed.

2. The method defined in claim 1, further comprising:
   during each processing session, iteratively processing successively larger portions of the extracted testable subgraph by successively increasing how many of the edges may be included in test paths in the extracted testable subgraph.

3. The method defined in claim 1 wherein at least some of the nodes represent logic elements, the method further comprising:
   using the programmable logic device test generation tool to identify at least some test paths in the testable subgraphs that start and end at the logic elements.

4. The method defined in claim 1 wherein at least some of the nodes represent input-output pins, the method further comprising:
   using the programmable logic device test generation tool to identify at least some test paths in the testable subgraphs that start or end at the input-output pins.

5. The method defined in claim 1 wherein the programmable logic device test generation tool comprises a graph generation tool and wherein generating the graph comprises using the graph generation tool to generate the graph from a circuit description of the programmable logic device integrated circuit.

6. The method defined in claim 1 wherein the programmable logic device test generation tool comprises an automatic test generator and wherein using the programmable logic device test generation tool to extract the testable subgraphs comprises using the automatic test generator to process the graph to extract the multiple subgraphs.

7. The method defined in claim 1 wherein the programmable logic device test generation tool comprises an automatic test generator and wherein using the programmable logic device test generation tool to extract the testable subgraphs comprises using the automatic test generator to extract the testable subgraphs by applying a different set of test constraints to the graph for each of the testable subgraphs.

8. The method defined in claim 1 wherein the programmable logic device includes programmable elements that are loaded with the test configuration data during testing, wherein at least some of the nodes represent input/output pins, and wherein the edges represent programmable connections that are controlled by signals from the programmable elements, the method further comprising:
   during each processing session, iteratively processing successively larger portions of the extracted testable subgraph by successively extracting increasingly large portions of the extracted testable subgraph by increasing how many edges are included in test paths in the extracted testable subgraph.

9. The method defined in claim 1 further comprising:
   providing test constraints; and
   using the test constraints in extracting the testable subgraphs.

10. The method defined in claim 9 further comprising using a timing analysis tool to compute at least some of the test constraints.

11. The method defined in claim 9 wherein the test constraints include constraints limiting which edges are available to test, the method further comprising:
    using the test constraints limiting which edges are available to test in extracting the testable subgraphs.

12. The method defined in claim 9 wherein at least some of the nodes represent I/O pins and wherein the test constraints include constraints limiting which I/O pins are available to test, the method further comprising:
    using the test constraints limiting which I/O pins are available to test in extracting the testable subgraphs.

13. The method defined in claim 1 wherein using the programmable logic device test generation tool to automatically extract the multiple testable subgraphs from the graph G comprises using the cost function to produce test constraints used in extracting the testable subgraphs.

14. A method for testing a programmable logic device integrated circuit, comprising:

using a programmable logic device test generation tool to generate a graph G from a circuit description of the programmable logic device integrated circuit;

using the programmable logic device test generation tool to automatically extract multiple testable subgraphs from the graph G, wherein the graph G and the multiple testable subgraphs include nodes and edges;

processing each extracted testable subgraph in a separate processing session with the programmable logic device test generation tool to produce a corresponding set of test configuration data and test vectors for testing the programmable logic device;

during the processing of each extracted testable subgraph, using a cost function in the programmable logic device test generation tool to determine which portion of the extracted testable subgraph to process, wherein using the cost function to determine which portion of the extracted testable subgraph to process comprises using the programmable logic device test generation tool to automatically extract multiple subsets from the extracted subgraph based on an incrementing hop number index that indicates how many graph edges are permitted in test paths in each subset;

providing the test configuration data and test vectors from the programmable logic device test generation tool to a tester; and using the tester to load the test configuration data into the programmable logic device integrated circuit, apply the test vectors, and monitor resulting signals from the programmable logic device integrated circuit.

15. The method defined in claim 14 wherein using the programmable logic device test generation tool to automatically extract multiple testable subgraphs from the graph G comprises:

selecting different sets of test constraints with the programmable logic device test generation tool; and applying each different set of test constraints to the graph G to extract a corresponding one of the multiple testable subgraphs.

16. The method defined in claim 14 wherein using the tester to monitor the resulting signals from the programmable logic device integrated circuit comprises using a scan chain on the programmable logic device integrated circuit to capture the resulting signals.

17. The method defined in claim 14 wherein using the tester to apply the test vectors to the programmable logic device integrated circuit comprises applying at least some of the test vectors using input/output pins on the programmable logic device integrated circuit, wherein at least one of the extracted testable subgraphs includes nodes representing the input/output pins.

18. The method defined in claim 14 wherein using the tester to apply the test vectors to the programmable logic device integrated circuit comprises applying at least some of the test vectors using programmable logic device logic elements on the programmable integrated circuit, wherein at least one of the extracted testable subgraphs includes nodes representing the programmable logic device logic elements.

19. The method defined in claim 14 further comprising using a target test coverage value in determining when each extracted testable subgraph has been processed sufficiently by the programmable logic device test generation tool.

20. The method defined in claim 14 further comprising using a saturation threshold in determining when progress has saturated when incrementing the hop number index during processing of each extracted testable subgraph with the programmable logic device test generation tool.

21. The method defined in claim 14 further comprising ending processing of a given one of the extracted testable subgraphs and beginning processing of another of the extracted testable subgraphs with the programmable logic device test generation tool when it is determined that a target test coverage has been achieved or that processing of the given one of the extracted testable subgraphs has saturated as the hop number index is incremented.

22. Software on a computer-readable storage medium for execution on computing equipment for generating test configuration data and test vectors for testing a programmable logic device integrated circuit, comprising:

code for generating a graph of the programmable logic device integrated circuit;

code for automatically extracting multiple testable subgraphs from the graph in separate processing sessions;

code for processing each extracted testable subgraph in a separate processing session to produce a corresponding set of test configuration data and test vectors for testing the programmable logic device;

code for automatically extracting a portion of each testable subgraph using a cost function; and code for automatically incrementing a cost function threshold in successive processing iterations of each processing session to selectively increase the portion of the extracted testable subgraph that is extracted.

* * * * *

UNITED STATES PATENT AND TRADEMARK OFFICE
CERTIFICATE OF CORRECTION

PATENT NO. : 7,373,621 B1 Page 1 of 1
APPLICATION NO. : 11/048356
DATED : May 13, 2008
INVENTOR(S) : Jayabrata Ghosh Dastidar It is certified that error appears in the above-identified patent and that said Letters Patent is hereby corrected as shown below:

In claim 1, at column 17, line 55, "procession" should be changed to --processing--

Signed and Sealed this

Twenty-ninth Day of July, 2008

JON W. DUDAS
*Director of the United States Patent and Trademark Office*